United States Patent
Rotem et al.

(10) Patent No.: US 9,865,503 B2
(45) Date of Patent: Jan. 9, 2018

(54) METHOD TO PRODUCE A SEMICONDUCTOR WAFER FOR VERSATILE PRODUCTS

(71) Applicant: MARVELL ISRAEL (M.I.S.L) LTD., Yokneam (IL)

(72) Inventors: Eran Rotem, Haifa (IL); Rami Zemach, Givat Shapira (IL); Itay Peled, Hagor (IL)

(73) Assignee: MARVELL ISRAEL (M.I.S.L) LTD., Yokneam (IL)

( * ) Notice: Subject to any disclaimer, the term of this patent is extended or adjusted under 35 U.S.C. 154(b) by 0 days.

(21) Appl. No.: 15/330,781

(22) Filed: Nov. 7, 2016

(65) Prior Publication Data

US 2017/0133271 A1     May 11, 2017

Related U.S. Application Data

(60) Provisional application No. 62/252,078, filed on Nov. 6, 2015.

(51) Int. Cl.
| | |
|---|---|
| *H01L 21/82* | (2006.01) |
| *H01L 23/58* | (2006.01) |
| *H01L 23/00* | (2006.01) |
| *G06F 17/50* | (2006.01) |

(52) U.S. Cl.
CPC .......... *H01L 21/82* (2013.01); *G06F 17/5072* (2013.01); *H01L 23/564* (2013.01); *H01L 23/585* (2013.01)

(58) Field of Classification Search
CPC ..... H01L 21/82; H01L 23/564; H01L 23/585; G06F 17/5072
See application file for complete search history.

(56) References Cited

U.S. PATENT DOCUMENTS

| | | | |
|---|---|---|---|
| 6,383,847 B1 * | 5/2002 | Ditlow | G03F 1/00 438/128 |
| 2007/0196958 A1 * | 8/2007 | Bhattacharya | H01L 27/0207 438/128 |

* cited by examiner

*Primary Examiner* — Karen Kusumakar

(57) ABSTRACT

Aspects of the disclosure provide a method for semiconductor wafer manufacturing. The method includes utilizing a subset of lower level masks in a mask set to form multiple modular units of lower level circuit structures on a semiconductor wafer. The mask set includes the subset of lower level masks and at least a first subset of upper level masks and a second subset of upper level masks. The first subset of upper level masks defines intra-unit interconnections. The second subset of upper level masks defines both intra-unit interconnections and inter-unit interconnections. The method further includes selecting one of at least the first subset of upper level masks and the second subset of upper level masks based on a composition request of a final integrated circuit (IC) product and utilizing the selected subset of upper level masks to form upper level structures on the semiconductor wafer.

20 Claims, 6 Drawing Sheets

METHOD TO PRODUCE A SEMICONDUCTOR WAFER FOR VERSATILE PRODUCTS

INCORPORATION BY REFERENCE

This present disclosure claims the benefit of U.S. Provisional Application No. 62/252,078, "SHARING DIES ON THE SAME SILICON WAFER" filed on Nov. 6, 2015, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the semiconductor industry, circuit designers design a product via a plurality of stages. In an example, the circuit designers decide system-level functional specification and architectures of the product in a system design stage. Further, the circuit designers convert the system-level functional specification into a register transfer level (RTL) description in a RTL design stage. Then, the circuit designers create circuit layout with patterns to define circuits in a physical design stage. Based on the circuit layout, a set of photomasks is generated. The photomasks are used in a semiconductor manufacturing facility to define structures corresponding to the circuits on semiconductor wafers.

SUMMARY

Aspects of the disclosure provide a method for semiconductor wafer manufacturing. The method includes utilizing a subset of lower level masks in a mask set to form multiple modular units of lower level circuit structures on a semiconductor wafer. The mask set includes the subset of lower level masks and at least a first subset of upper level masks and a second subset of upper level masks. The first subset of upper level masks defines intra-unit interconnections that interconnect the lower lever circuit structures within a modular unit. The second subset of upper level masks defines both intra-unit interconnections that interconnect the lower level circuit structures within a modular unit, and inter-unit interconnections that interconnect the lower level circuit structures in different modular units. The method further includes selecting one of at least the first subset of upper level masks and the second subset of upper level masks based on a composition request of a final integrated circuit (IC) product and utilizing the selected subset of upper level masks to form upper level structures on the semiconductor wafer.

To utilize the subset of lower level masks in the mask set to form the multiple modular units of lower level circuit structures on the semiconductor wafer, in an example, the method includes utilizing the subset of lower level masks in the mask set to form the multiple modular units of lower level circuit structures that a modular unit of lower level circuit structures resides in a circuit region defined by a modular circuit perimeter.

To select the one of at least the first subset of upper level masks and the second subset of upper level masks based on the composition request of the final IC product, in an embodiment, the method includes selecting the first subset of upper level masks when the composition request is indicative of a single modular unit in the final IC product. Further, the method includes dicing the semiconductor wafer along scribe line area between the modular units.

In another embodiment, the method includes selecting the second subset of upper level masks when the composition request is indicative of at least a first modular unit and a second modular unit in the final IC product. Further, the method includes dicing the semiconductor wafer without dicing along scribe line area between the first modular unit and the second modular unit. In an example, the method includes utilizing the second subset of upper level masks to form the intra-unit interconnections that interconnect the lower lever circuit structures within a modular unit, and the inter-unit interconnections that interconnect the lower level circuit structures in different modular units.

According to an aspect of the disclosure, the method includes utilizing the second subset of upper level masks to form open seal ring structures that define modular unit perimeter with openings to allow the inter-unit interconnections to interconnect the lower level circuit structures in different modular units.

Aspects of the disclosure provide method to design integrated circuit. The method includes designing a layout including lower level layers and upper level layers, the lower level layers defining multiple modular units of lower level circuit structures, and the upper level layers defining intra-unit interconnections that interconnect the lower level circuit structures within respective modular units, designing replacement upper level layers to replace the upper level layers, the replacement upper level layers defining both intra-unit interconnections that interconnect the lower level circuit structures within respective modular units, and inter-unit interconnections that interconnect the lower level circuit structures in different modular units and generating a data file for creating a mask set that includes the lower level layers, the upper level layers and the replacement upper level layers.

Aspects of the disclosure provide an integrated circuit (IC) formed on a substrate. The IC includes a first modular unit with first circuit structures in a first modular circuit perimeter, a second modular unit with second circuit structures in a second modular circuit perimeter separated from the first modular circuit perimeter by a scribe line area and interconnections configured to cross the scribe line area to interconnect the first circuit structures with the second circuit structures.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
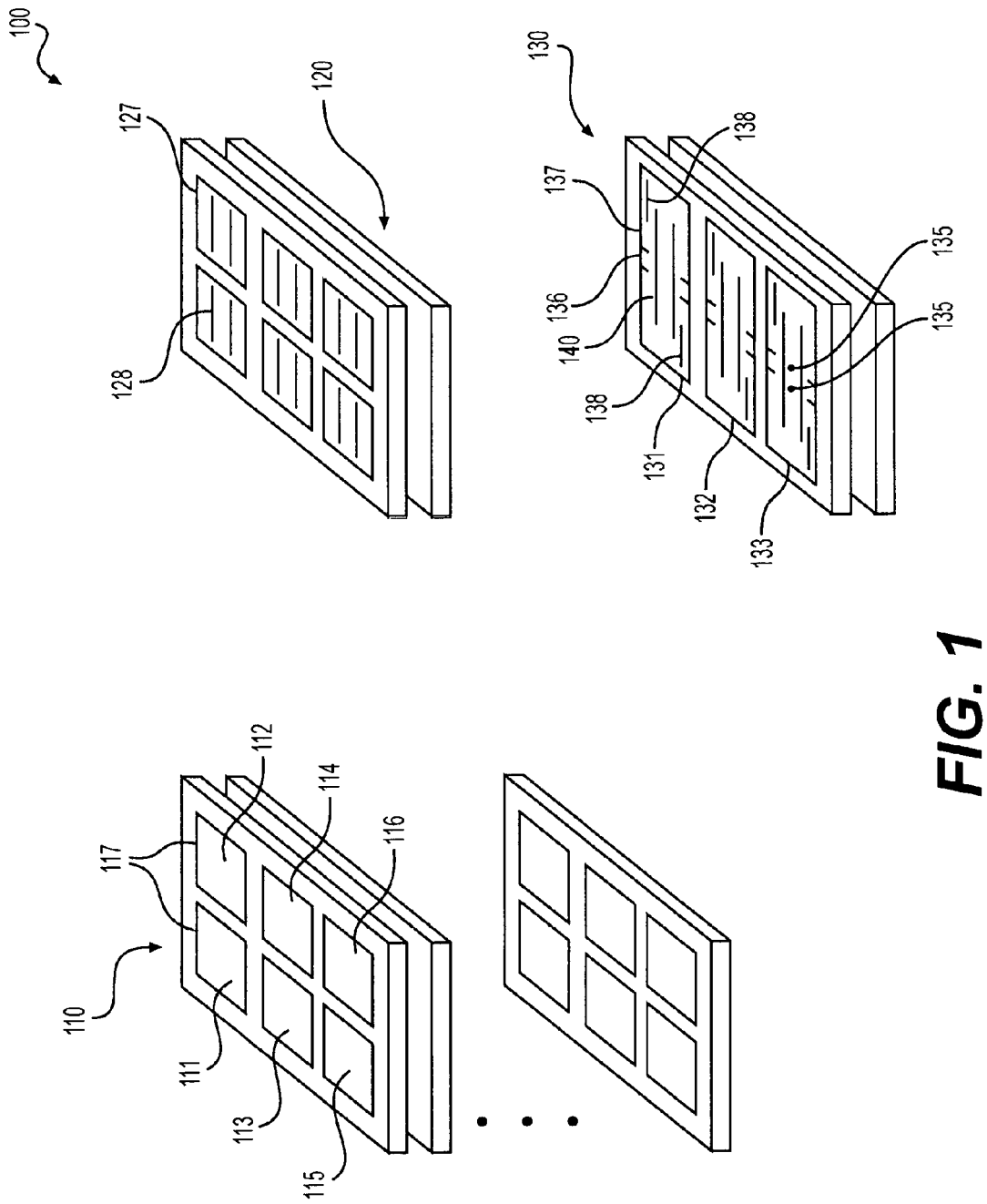
FIG. 1 shows a diagram of a set of photomasks 100 according to an embodiment of the disclosure.

FIG. 1 shows a diagram of a set of photomasks 100 for integrated circuit (IC) products according to an embodiment of the disclosure. The set of photomasks 100 includes a subset of lower level photomasks 110 and multiple subsets of upper level photomasks 120-130. In the FIG. 1 example, the set of photomasks 100 includes a first subset of upper level photomasks 120 and a second subset of upper level photomasks 130. Each of the multiple subsets of upper level photomasks 120-130 is workable with the subset of lower level photomasks 110. For example, the first subset of upper level photomasks 120 and the subset of lower level photomasks 110 are used to manufacture one or more IC products; and the second subset of upper level photomasks 130 and the subset of lower level photomasks 110 are used to manufacture a different IC product from the one or more IC products, such as an IC product that combines two or more units of the one or more IC products.

According to an aspect of the disclosure, the set of photomasks 100 is generated based on circuit layout provided by circuit designers, and is used at a semiconductor manufacturing facility to manufacture variety of IC products.

In an embodiment, at a system design stage, the circuit designers design a composite system that combines two or more component systems. In an example, each of the component systems is an individually operable system that does not rely on the other component systems, and the two or more component systems are combined using communication channels to form the composite system. For example, a component system is a network switch system with a bandwidth of 5 terabits per second (Tbps). A composite system combines multiple network switch systems (e.g., two, four . . . ) to form a larger network switch system with a larger bandwidth (e.g., 10 Tbps, 20 Tbps . . . ). The circuit designers determine system-level functional specification and architectures of the composite system, and the component systems. In an example, the circuit designers determine system-level functional specification and architectures of the component systems, and combine the component systems using communication channels to form the composite system. For example, the circuit designers generate a communication channel between two component systems. In the example, each component system includes interfaces to the communication channel, and sends data signals or control signals to the other component system via the communication channel.

Further in an embodiment, at a register transfer level (RTL) stage, the circuit designers convert the system-level functional specification of the component systems and the composite system into a register transfer level (RTL) description. In an embodiment, the circuit designers convert the system-level functional specification of the component systems into the RTL description. In an example, when the component systems are of the same system-level functional specification, the circuit designers convert the system-level functional specification of a component system into the RTL description. In another example, when the component systems are of different system-level functional specification, the circuit designers convert the system-level functional specification of the respective component systems into the RTL description.

Further, the circuit designers combine the RTL description of the component systems using signal transmission models to form the RTL description of the composite system.

Then, at a physical design stage, the circuit designers create layout for the component systems and the composite system. In an embodiment, the circuit designers create modular layout for the component systems. The modular layout includes patterns in various layers, such as an active layer, a well layer, a polysilicon layer, a source/drain layer, contact layers, a plurality of metal layers, via layers, and the like to form circuit structures in the component systems. In an example, the metal layers are separately referred as lower metal layers and upper metal layers. In a typical semiconductor manufacturing process, the upper metal layers are generated and patterned on a semiconductor substrate later than the lower metal layers. In an example, a semiconductor manufacturing process five metal layers are produced. The first three metal layers in the semiconductor manufacturing process are referred to as lower metal layers, and the last two metal layers in the semiconductor manufacturing process are referred to as upper metal layers. In an example, the semiconductor manufacturing process patterns the semiconductor wafer from bottom up, the upper level metal layers are disposed on top of the lower level metal layers.

In an example, when the component systems are of the same RTL description, the circuit designers create a modular layout for a component system, and suitably adjust the modular layout for other component systems. In another example, when the component systems are of different RTL description, the circuit designers create respective modular layouts for the component systems.

Further, the circuit designers suitably place the modular layouts together to form a layout including the component systems in the composite system. Then, the circuit designers create at least one replacement upper layer, such as a replacement upper metal layer, a replacement via layer, and the like to replace upper layers in order to combine the component systems into the composite system. The replacement upper layers include patterns to form the interconnections that connect the component systems.

In an embodiment, the circuit designers determine constrains for creating the modular layouts of the component systems in order to facilitate combining the component systems. In an example, the circuit designers limit a dimension of the modular layouts for the component systems to be about the same size, or within a size range. In another example, the circuit designers specify a specific area in a modular layout for circuits interfacing with the interconnections.

It is noted that the circuit designers add other suitable patterns, such as dummy patterns, parametric test structures, alignment marks, and the like in the layout for various other purposes.

It is noted that the circuit designers perform other suitable design steps, such as simulation, optimization, design for testing, design for manufacturing and the like. When the layout that includes the replacement upper layers is finalized, the circuit designers create a data file for the layout. Based on the data file, a set of photomasks, such as the set of photomask 100 is created, and used in semiconductor wafer manufacturing.

According to an aspect of the disclosure, the set of photomasks 100 is suitably used at a semiconductor manufacturing facility for manufacturing of multiple products, for example, according to market demands or customer requirement for multiple different products. For example, when a customer has a need for a product out of the multiple differing possible products, a request that is indicative of, for example, a product having all or alternatively only a subset of possible product features or capabilities, a request for the type of product needed is generated and sent to the semiconductor manufacturing facility. At the semiconductor manufacturing facility, a subset of upper level photomasks 120-130 corresponding to the product is selected in response to the request. The semiconductor manufacturing facility uses the lower level photomasks 110 and the selected subset of upper level photomasks to produce semiconductor wafers. The semiconductor wafers are further processed, such as passivated, tested, sawed, and the like to produce the products that meet the customer need In another example, the semiconductor manufacturing facility uses the subset of lower level photomasks 110 to produce semi-manufactured semiconductor wafers with lower level circuit structures, such as wells, active region, isolation, polysilicon gate, source, drain, contact, local interconnections in the lower metal layers, and the like. Further, in the example, the semiconductor manufacturing facility receives a request that is generated based on, for example, a customer need for a product. In an example, the request is indicative of compositions in the product. Based on the request, a subset of upper level photomasks corresponding to the product is selected. The semiconductor manufacturing facility then uses the selected subset of upper level photomasks to further process one or more semi-manufactured semiconductor wafers to generate the upper level circuit structures, such as vias, interconnections in the upper metal layers, and the like on the semiconductor wafers. The semiconductor wafers are further processed, such as passivated, tested, sawed, and the like to produce the products that meet the market demand.

According to an aspect of the disclosure, one or more photomasks in the subset of lower level photomasks 110, such as a polysilicon photomask, a contact hole photomask, and the like, include fine patterns that require relatively high resolution, and thus the one or more photomasks are produced with a relatively large cost. The interconnections are in the upper metal layers, and generally have relatively large dimensions, such as a relatively large width, compared to the polysilicon dimensions. The photomasks for the upper metal levels are generally produced with a relatively low cost. In the example, the complete set of photomasks 100 is used to manufacture multiple IC products that share the lower level photomasks 110, but which are differentiated by the use of different upper level photomasks 120 that provide different interconnections of circuit components generated by the lower level photomasks 110.

Generally, the dominant factor of non-recurring engineering (NRE) one time cost is the photomask cost. In an example, a set of photomasks in 14 nm technology costs about 5 million dollars. According to the disclosure, the set of photomasks 100 is used to manufacture multiple IC products, thus the cost of the photomasks 100 is justified by a total volume of the multiple IC products to improve return on investment (ROI).

According to an aspect of the disclosure, the multiple IC products are designed to share patterns for the lower level circuit structures, such as patterns of the polysilicon structures, patterns of contact hole structures, and the like. The multiple IC products are designed to be distinguishable by patterns in the upper level circuit structures, such as patterns of the upper metal layers.

Specifically, in the FIG. 1 example, the subset of lower level photomasks 110 and the first subset of upper level photomasks 120 are used to produce products of component systems, and the subset of lower level photomasks 110 and the second subset of upper level photomasks 130 are used to produce product of a composite system. For example, the subset of lower level photomasks 110 defines lower level circuit structures for six modular circuit units (e.g., 111-116) of component systems. In an example, each modular unit is surrounded by a seal ring, and the subset of lower level photomasks 110 includes patterns 117 to form the seal rings that respectively surround the six modular circuit units. For example, the modular circuit units 111, 113 and 115 are units of a first component system (e.g., component system A in FIGS. 2-4), the modular circuit units 112, 114 and 116 are units of a second component system (e.g., component system B in FIGS. 2-4).

It is noted that a composite system AB that includes the component system A and the component system B share the same lower level circuit structures with a combination of the component system A and the component system B. Thus, in an example, the subset of lower level photomasks 110 also defines lower level circuit structures for three units of composite systems, such as a first composite unit that combines the modular circuit units 111 and 112, a second composite unit that combines the modular circuit units 113 and 114, and a third composite unit that combines the modular circuit unit 115 and 116.

Generally, a seal ring surrounds interior core circuitry of a circuit unit, for example, a seal ring is disposed between an edge of a die and the interior core circuitry in the die. The seal ring typically includes metal structures that are constructed simultaneously with the standard metal structures in the interior core circuitry to limit the intrusion of any cracks into the interior core circuitry for example, during a sawing process to separate dies on a semiconductor wafer. Also, the seal ring prevents moisture penetration or chemical damage like acid, alkaline containing or diffusion of contaminating species to the interior core circuitry. In an example, the seal ring is formed in a back-end of a semiconductor process, such as with process to form metal lines. For example, a back-end of the semiconductor process includes steps to form five layers of metal lines and vias between the metal lines, and the seal ring is formed by the steps to form the metal lines and vias, and includes a stack of metal lines and vias in an example.

Further, in the example seen in FIG. 1, the first subset of upper level photomasks 120 includes patterns 128 (intra-unit patterns) that define upper level structures (e.g., intra-unit interconnections) respectively for six modular circuit units of component systems. In the FIG. 1 example, the first subset of upper level photomasks 120 includes patterns 127 that define complete (closed) seal rings in the upper level structures to respectively enclose the six modular circuit units. Thus, when the first subset of upper level photomasks 120 is used with the subset of lower level photomasks 110 in a semiconductor wafer process, fully encapsulated component system A and fully encapsulated component system B are produced.

The second subset of upper level photomasks 130 includes patterns 138 (intra-unit patterns) that define upper level structures (e.g., intra-unit interconnections) respectively disposed entirely within respective ones of the six modular circuit units, and includes patterns 140 (inter-unit patterns) defining upper metal structures (e.g., inter-unit interconnections) that interconnect a modular circuit unit of component system A and a modular circuit unit of component system B to form a unit of the composite system AB. In the FIG. 1 example, the second subset of upper level photomasks 130 includes patterns 137 that define seal rings with openings 135 through which inter-unit patterns pass, and with connections 136 that connect seal rings of the component systems to form a complete seal ring around the composite system AB. It is noted that, solely for illustrative teaching purposes, the openings 135 seen in FIG. 1 are considerably larger proportionally than would actually be manufactured. The seal rings in the upper level photomasks 130 are purposely formed with openings 135 to facilitate routing of the inter-unit interconnections. Thus, when the second subset of upper level photomasks 130 is used with the subset of lower level photomasks 110 in a semiconductor wafer process, a composite system AB that includes component system A and component B is produced. For example, the second subset of upper level photomasks 130 defines upper level structures for composite units 131, 132 and 133.

In an example, the component system A has the same system-level functional specification of the component system B, and the component system A is implemented with the same RTL description, and same modular layout as the component system B. It is noted that, in an example, the modular layout of the component system A has a different orientation from the modular layout of the component system B, for instance system A is a mirrored image of system B, in an embodiment.

In another example, the component system A has different system-level functional specification from the component system B, and the component system A is implemented with the different RTL description, and different modular layout from the component system B.

Figure 2:
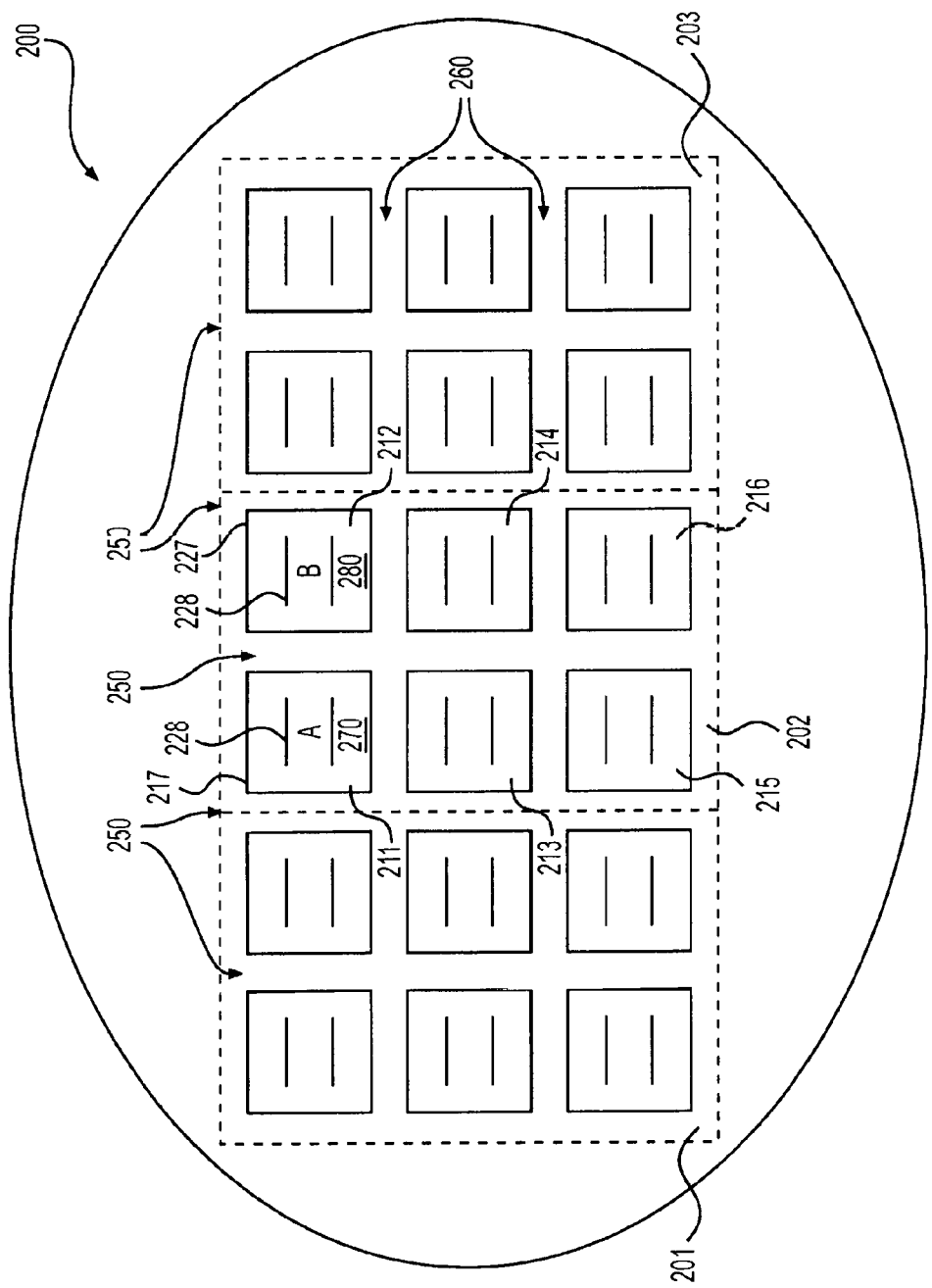
FIG. 2 shows a diagram of a semiconductor wafer 200 manufactured using the photomasks 100 according to an embodiment of the disclosure.

FIG. 2 shows a diagram of a semiconductor wafer 200 according to an embodiment of the disclosure. In an example, the semiconductor wafer 200 is produced using the subset of the lower level photomasks 110 and the first subset of the upper level photomasks 120.

In the FIG. 2 example, the semiconductor wafer 200 is patterned by groups, such as a first group 201, a second group 202, a third group 203, and the like. In an example, modular circuit units in a group are patterned together according to the photomasks. For example, during a photolithography process, a suitable photomask from the subset of the lower level photomasks 110 and the first subset of the upper level photomasks 120 is selected, and installed on a lithography projection system (e.g., a stepper, a scanner). The semiconductor wafer 200 is covered with photoresist. The lithography projection system exposes the photoresist at a suitable location of the semiconductor wafer 200 according to the selected photomask to transfer patterns on the photomask to the photoresist at the suitable location as a group.

Then, in an example, the semiconductor wafer 200 is moved relatively to the suitable photomask, and the lithography projection system exposes the photoresist on another location of the semiconductor wafer 200 according to the selected photomask to transfer the patterns on the photomask to the photoresist at the other location as another group.

In the FIG. 2 example, because the semiconductor wafer 200 is produced based on the subset of the lower level photomasks 110 and the first subset of the upper level photomasks 120, each group includes six dies, such as dies 211-216 and the like. Each die is surrounded by a seal ring 227, and the dies are separated by scribe lines 250 and 260.

In an example, the dies are sawed off the semiconductor wafer 200 along the scribe lines 250 and 260.

In the FIG. 2 example, each group, such as the second group 202, includes six modular circuit units of component systems. For example the dies 211, 213 and 215 are modular circuit units of component system A 270, and the dies 212, 214 and 216 are modular circuit units of component system B 280. In the FIG. 2 example, each modular circuit unit includes upper metal lines 228 (intra-unit interconnections) that are patterned according to the intra patterns 128 in the FIG. 1 example. Further, each modular unit includes the complete (close) seal rings 227 that are patterned according to the patterns 117 in the subset of lower level photomasks 110 and the patterns 127 in the first subset of upper level photomasks 120.

In the FIG. 2 example, the semiconductor wafer 200 is sawed along the scribe lines 250 and 260 to generate eighteen separate units of component systems.

Figure 3:
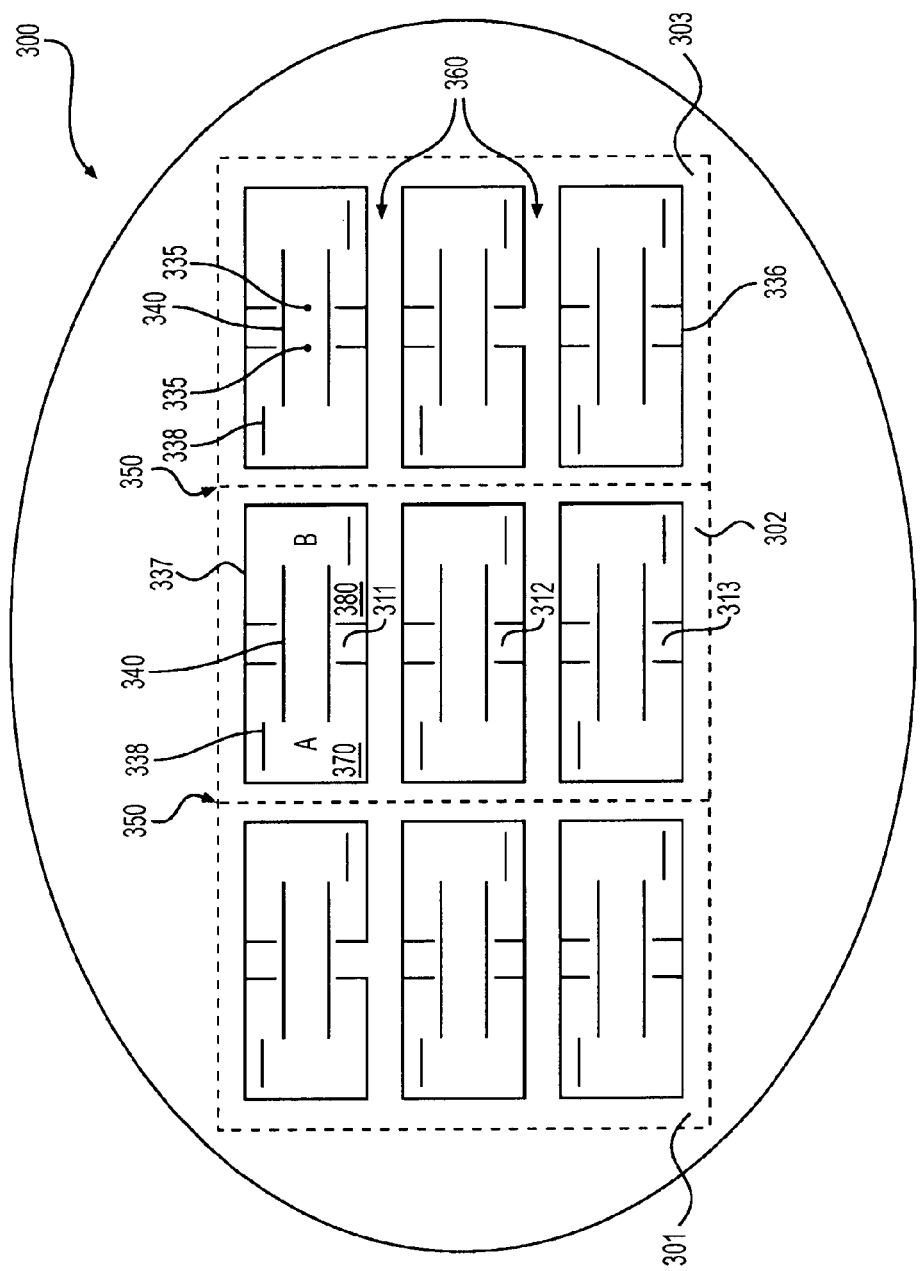
FIG. 3 shows a diagram of another semiconductor wafer 300 manufactured using the photomasks 100 according to an embodiment of the disclosure.

FIG. 3 shows a diagram of another semiconductor wafer 300 according to an embodiment of the disclosure. In an example, the semiconductor wafer 300 is produced using the subset of the lower level photomasks 110 and the second subset of the upper level photomasks 130.

In the FIG. 3 example, the semiconductor wafer 300 is patterned by groups, such as a first group 301, a second group 302, a third group 303, and the like. In an example, units in a group are patterned together according to the photomasks. In an example, the semiconductor wafer 300 is manufactured using the same process that is used to manufacture the semiconductor wafer 200, but the components formed on wafer 200 are patterned using the lower level photomasks 110 along with the second subset of upper level photomasks 130 instead of the first subset of upper level photomasks 120.

In the FIG. 3 example, because the semiconductor wafer 300 is produced based on the subset of lower level photomasks 110 and the second subset of upper level photomasks 130, each group includes three units of composite system AB. For example, the group 302 includes three units 311, 312 and 313 of the composite system AB. Each unit of the composite system AB includes a component system A (e.g. 370), and a component system B (e.g. 380). In the FIG. 3 example, each component system includes upper metal lines 338 (intra-unit interconnections) that are patterned according to the intra patterns 138 in the FIG. 1 example. In addition, the composite system AB includes interconnection metal lines 340 (inter-unit interconnections) that are patterned according to the inter patterns 140 in the FIG. 1 example to interconnect the component system A and the component system B to form the composite system AB.

In the FIG. 3 example, the seal rings include a seal ring 337 with openings 335 and connections 336 in the upper metal layers. The seal ring 337 is patterned according to the patterns 137 in the upper level photomasks 130. Specifically, the seal ring 337 is formed by connecting two open rings using the connections 336. The open rings have the openings 335 that are purposely opened at selected locations to facilitate routing of the interconnection metal lines 340.

In the FIG. 3 example, the dies are sawed off the semiconductor wafer 300 along the scribe lines 350 and 360, thus each die includes a composite system AB.

Figure 4:
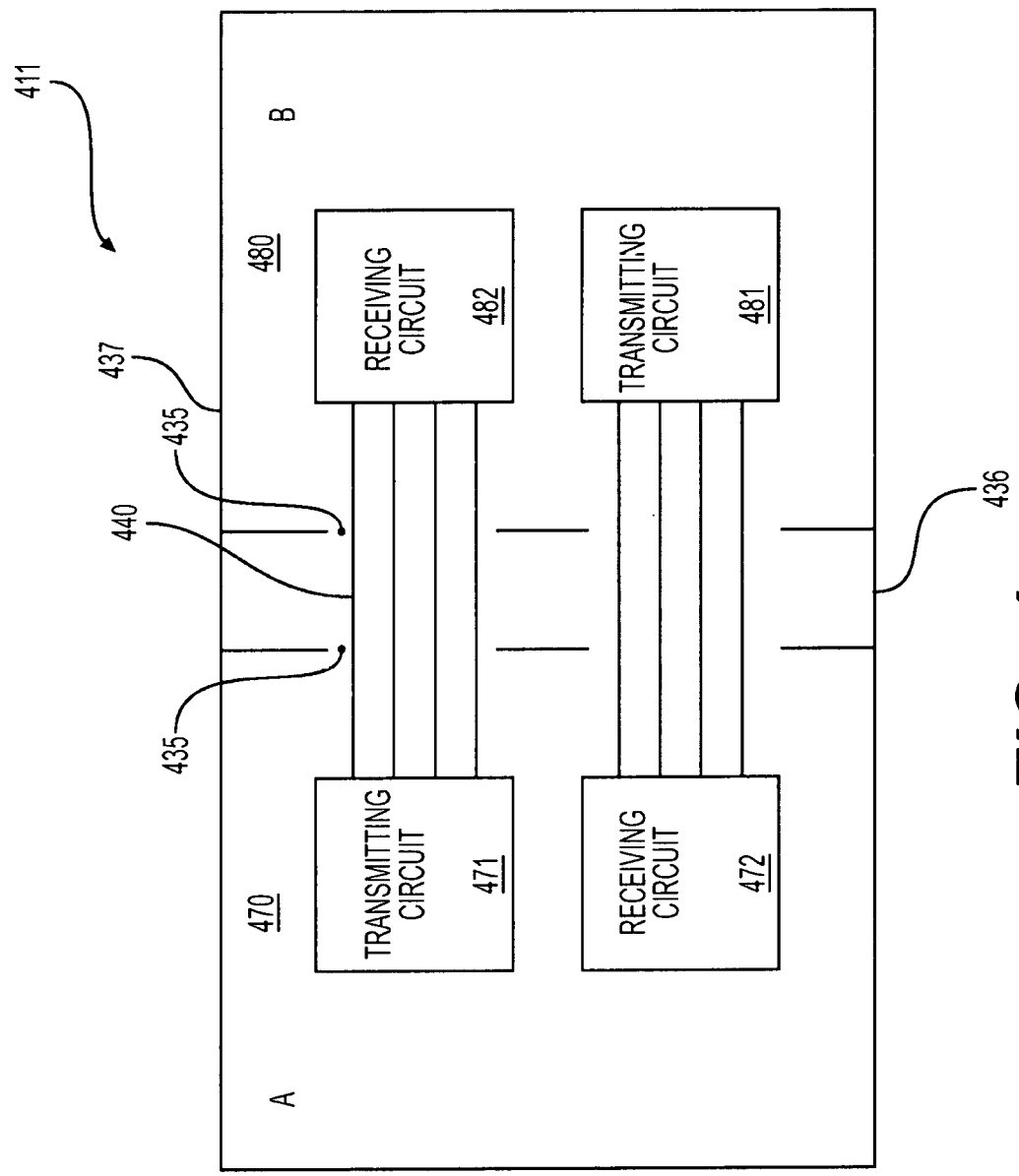
FIG. 4 shows a diagram of an integrated circuit (IC) manufactured using the photomasks 100 according to an embodiment of the disclosure.

FIG. 4 shows a block diagram of an integrated circuit (IC) die 411 according to an embodiment of the disclosure. In an example, the die 411 is sawed off from the semiconductor wafer 300.

The die 411 is a composite system that includes a first component system 470 and a second component system 480.

In an example, the first component system 470 is the same as the second component system 480. It is noted that, in an example, corresponding structures in the first component system 470 and the second component system 480 have the same shape but different orientations. In another example, the first component system 470 is different from the second component system 480.

The first component system 470 and the second component system 480 respectively include interfaces to support signal transmissions between the two component systems. Specifically, in the FIG. 4 example, the first component system 470 includes a first transmitting circuit 471 and a first receiving circuit 472, and the second component system 480 includes a second transmitting circuit 481 and a second receiving circuit 482.

The die 411 then includes interconnection metal lines 440 that are formed, for example, according to the inter patterns 140 in the second subset of upper level photomasks 130. The interconnection metal lines 440 enable the signal transmission between the two component systems so that they operate as an integral unit. For example, the first transmitting circuit 471 is connected to the second receiving circuit 482 via the interconnection metal lines 440, thus the first transmitting circuit 471 transmits signals via the interconnection metal lines 440, and the second receiving circuit 482 receives the signals from the interconnection metal lines 440.

In the FIG. 4 example, the first component system 470 and the second component system 480 are protected by a seal ring 437 that includes openings 435 and connections 436 in the upper metal layers. Specifically, the seal ring 437 is formed by connecting two open rings using the connections 436. The open rings have the openings 435 that are purposely opened at selected locations to facilitate routing of the interconnection metal lines 440. The seal ring 437 is patterned according to, for example the patterns 137 in the second subset of the upper level photomasks 130, and are purposely formed with openings 435 to facilitate routing of the interconnection metal lines 440, and with the connections 436 to form a complete seal ring to protect the composite system. It is noted that the seal rings include closed rings (not show) in the lower level layers that are patterned according to, for example, the patterns 117 in the lower level photomasks 110.

Figure 5:
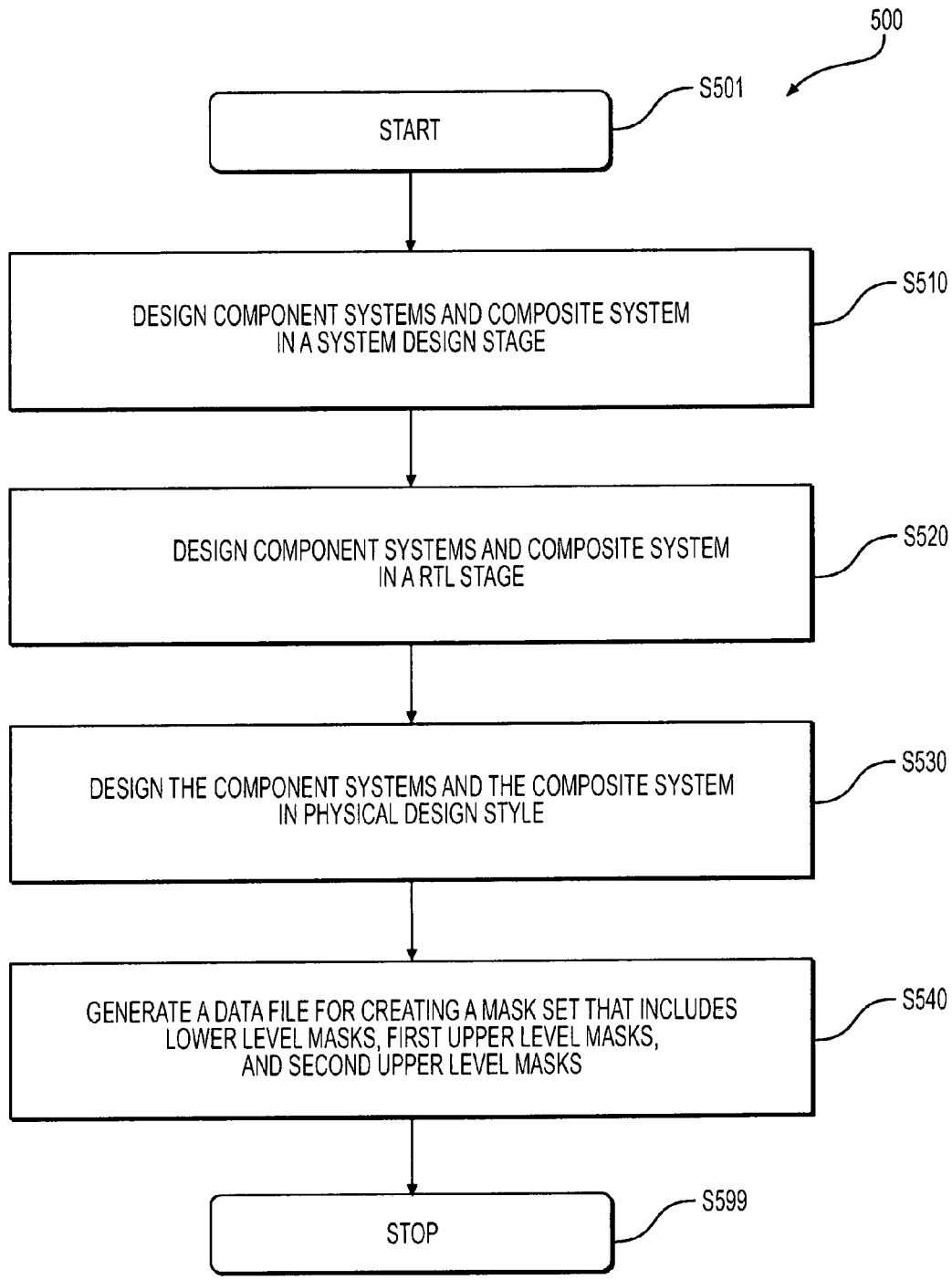
FIG. 5 shows a flow chart outlining a process 500 for generating the photomask 100 according to an embodiment of the disclosure.

FIG. 5 shows a flow chart outlining a process example 500 according to an embodiment of the disclosure. In an example, the process 500 is used to generate the set of photomasks 100. The process starts at S501 and proceeds to S510.

At S510, at a system design stage, circuit designers design component systems and a composite system that combines two or more component systems. In an example, each of the component systems is an individually operable system that does not rely on the other component systems, and the two or more component systems are combined using communication channels to form a composite system. For example, a component system is a network switch system with a bandwidth of 5 terabits per second (Tbps) having N physical network ports for example. A composite system combines multiple network switch systems (e.g., two, four . . . ) to form a larger network switch system with a larger bandwidth (e.g., 10 Tbps, 20 Tbps . . . ) having M×N physical network ports for example. The circuit designers determine system-level functional specification and architectures of the composite system, and the component systems. In an example, the circuit designers design system-level functional specification and architectures of the component systems, and combine the component systems using communication channels to form the composite system. For example, the circuit designers generate a communication channel between two component systems. In the example, each component system includes interfaces to the communication channel, and sends data signals or control signals to the other component system via the communication channel.

At S520, at a register transfer level (RTL) stage, the circuit designers convert the system-level functional specification of the component systems and the composite system into RTL description. In an embodiment, the circuit designers convert the system-level functional specification of the component systems into the RTL description. In an example, when the component systems are of the same system-level functional specification, the circuit designers convert the system-level functional specification of a component system into the RTL description. In another example, when the component systems are of different system-level functional specification, the circuit designers convert the system-level functional specification of the respective component systems into the RTL description.

Further, in an example, the circuit designers combine the RTL description of the component systems using signal transmission models to form the RTL description of the composite system.

At S530, at a physical design stage, the circuit designers create layout for the respective component systems and for the composite system. In an embodiment, the circuit designers create layout for the component systems. The layout includes patterns in various layers, such as an active layer, a well layer, a polysilicon layer, a source/drain layer, contact layers, a plurality of metal layers, via layers, and the like to form circuit structures in the component systems.

In an example, when the component systems are of the same RTL description, the circuit designers create a modular layout for a component system, and suitably adjust the modular layout for other component systems. In another example, when the component systems are of different RTL description, the circuit designers create respective modular layouts for the component systems.

Further, the circuit designers suitably place the modular layouts together to form a layout including the component systems in the composite system. Then, the circuit designers create at least one replacement upper layers, such as a replacement upper metal layer, a replacement via layer, and the like to replace upper layers in order to combine the component systems into the composite system. The replacement upper layers include patterns to form the inter-unit interconnections that connect the component systems.

In an embodiment, the circuit designers determine constraints for creating the modular layouts of the component systems in order to facilitate combining the component systems. In an example, the circuit designers limit a dimension of the modular layouts for the component systems to be about the same. In another example, the circuit designers specify a specific area in a modular layout for circuits interfacing with the interconnections.

It is noted that the circuit designers add other suitable patterns, such as dummy patterns, parametric test structures, alignment marks, and the like in the layout for other purposes, such as design for manufacturing purpose, testing purpose, alignment purpose, and the like.

At S540, a data file corresponding to the layout is generated. The data file is used to generate a set of photomasks, such as the set of photomasks 100, that include a subset of lower level photomasks (e.g., the subset of lower level photomasks 110) and multiple subsets of upper level photomasks (e.g., the first subset of upper level photomasks 120, the second subset of upper level photomasks 130). The set of photomasks 100 is then used in a semiconductor wafer manufacturing facility to manufacture semiconductor devices. The process proceeds to S599 and terminates.

Figure 6:
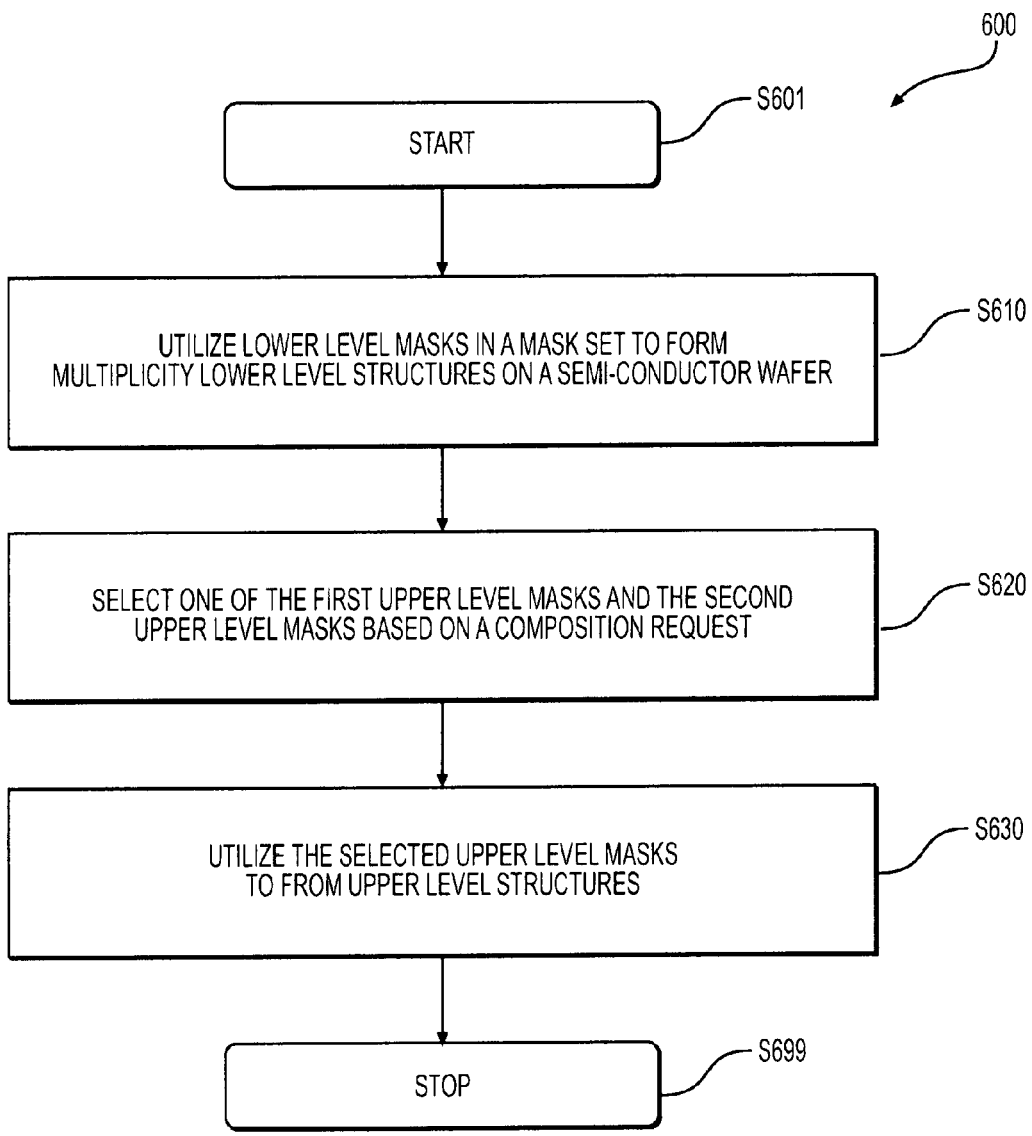
FIG. 6 shows a flow chart outlining a process 600 for semiconductor wafer manufacturing according the photomasks 100 according to an embodiment of the disclosure.

FIG. 6 shows a flow chart outlining a process 600 according to an embodiment of the disclosure. In an example, the process 600 is used in a semiconductor wafer manufacturing facility to produce ICs on semiconductor wafers using the set of photomasks 100. The process starts at S601 and proceeds to S610.

At S610, the subset of lower level photomasks 110 is used to produce multiple modular lower level structures on one or more semiconductor wafers. In an example, the semiconductor manufacturing facility uses the subset of lower level photomasks 110 to produce semi-manufactured semiconductor wafers with lower level circuit structures, such as wells, active region, isolation, polysilicon gate, source, drain, contact, local interconnections in the lower metal layers, and the like.

At S620, a subset of upper level photomasks is selected in response to a composition request. In an example, the semiconductor manufacturing facility receives a request that is generated based on, for example, market demand for a product or requests from specific customers. In an example, the request is indicative of a desired capacity or features of the product, such as a quantity of ports, capabilities or bandwidth in a network device. Based on the request, a subset of upper level photomasks corresponding to the product is selected. In an example, when the request is for component system A or component system B, the first subset of upper level photomasks 120 is selected. When the request is for the composite system AB, the second subset of upper level photomasks 130 is selected.

At S630, the selected upper level photomasks are used to produce upper level structures on the semi-manufactured semiconductor wafers. In an example, the semiconductor manufacturing facility then uses the selected subset of upper level photomasks to further process one or more partially manufactured semiconductor wafers to generate the upper level circuit structures, such as vias, interconnections in the upper metal layers, and the like on the semiconductor wafers. Then, the process proceeds to S699 and terminates.

It is noted that, in an example, the semiconductor wafers are further processed, such as passivated, tested, sawed, and the like to produce dies of the product that meet the market demand.

It is also noted that, in an example, the process 600 is suitably adjusted. For example, the request is first received, and a subset of upper level photomasks is selected in response to the request. Then, the semiconductor manufacturing facility uses the subset of the lower level photomasks 110 and the selected subset of upper level photomasks to produce one or more semiconductor wafers.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A method for semiconductor wafer manufacturing, comprising:
    utilizing a subset of lower level masks in a mask set to form multiple modular units of lower level circuit structures on a semiconductor wafer, wherein the mask set includes the subset of lower level masks and at least a first subset of upper level masks and a second subset of upper level masks, the first subset of upper level masks defines intra-unit interconnections that interconnect the lower lever circuit structures within a modular unit, and the second subset of upper level masks defines both intra-unit interconnections that interconnect the lower level circuit structures within a modular unit, and inter-unit interconnections that interconnect the lower level circuit structures in different modular units, the second subset of upper level masks further defining a ring that is punctuated by at least a pair of openings, the openings configured to pass interconnections between a first modular unit and a second modular unit;
    selecting one of at least the first subset of upper level masks and the second subset of upper level masks based on a composition request of a final integrated circuit (IC) product; and
    utilizing the selected subset of upper level masks to form upper level structures on the semiconductor wafer.

2. The method of claim 1 wherein utilizing the subset of lower level masks in the mask set to form the multiple modular units of lower level circuit structures on the semiconductor wafer further comprises:
    utilizing the subset of lower level masks in the mask set to form the multiple modular units of lower level circuit structures that a modular unit of lower level circuit structures resides in a circuit region defined by a modular circuit perimeter.

3. The method of claim 1, wherein selecting the one of at least the first subset of upper level masks and the second subset of upper level masks based on the composition request of the final IC product comprises:
    selecting the first subset of upper level masks when the composition request is indicative of a single self-contained modular unit in the final IC product.

4. The method of claim 3, further comprising:
    dicing the semiconductor wafer along scribe line area between the modular units to generate separate self-contained modular units defining the final IC product.

5. The method of claim 1, wherein selecting the one of at least the first subset of upper level masks and the second subset of upper level masks based on the composition request of the final IC product comprises:
    selecting the second subset of upper level masks when the composition request requests at least the first modular unit and the second modular unit being formed into the final IC product.

6. The method of claim 5, further comprising:
    dicing the semiconductor wafer without dicing along scribe line area between the first modular unit and the second modular unit to generate two or more integrated modular units defining the final IC product.

7. The method of claim 5, wherein utilizing the selected subset of upper level masks to form the upper level structures on the semiconductor wafer comprises:
    utilizing the second subset of upper level masks to form the intra-unit interconnections that interconnect the lower lever circuit structures within a modular unit, and the inter-unit interconnections that interconnect the lower level circuit structures in different modular units.

8. The method of claim 5, wherein utilizing the selected subset of upper level masks to form the upper level structures on the semiconductor wafer comprises:
    utilizing the second subset of upper level masks to form structures that define modular unit perimeter with openings to allow the inter-unit interconnections to interconnect the lower level circuit structures in different modular units.

9. A method to design integrated circuit, comprising:
designing a layout including lower level layers and upper level layers, the lower level layers defining multiple modular units of lower level circuit structures, and the upper level layers defining intra-unit interconnections that interconnect the lower level circuit structures within respective modular units;
designing replacement upper level layers to replace the upper level layers, the replacement upper level layers defining both intra-unit interconnections that interconnect the lower level circuit structures within respective modular units, and inter-unit interconnections that interconnect the lower level circuit structures in different modular units; and
generating a data file for creating a mask set that includes the lower level layers, the upper level layers and the replacement upper level layers.

10. The method of claim 9, wherein designing the replacement upper level layers to replace the upper level layers further comprising:
designing the replacement upper level layers that include patterns to form open seal ring structures that define modular unit perimeter with openings to allow the inter-unit interconnections to interconnect the lower level circuit structures in different modular units.

11. The method of claim 9, further comprising:
generating register transfer level (RTL) description respectively for multiple modular circuit units;
interconnecting the RTL description of the multiple modular units to form an RTL description for a composite circuit unit; and
designing the layout including the lower level layers, the upper level layers and the replacement upper level layers based on the RTL description of the modular circuit units and the composite circuit unit.

12. The method of claim 11, further comprising:
determining system-level functional specification respectively for the multiple modular circuit units, and the composite circuit unit.

13. An integrated circuit (IC) formed on a substrate, comprising:
a subset of lower level masks in a mask set to form multiple modular units of lower level circuit structures on a semiconductor wafer, wherein the mask set includes the subset of lower level masks and at least a first subset of upper level masks and a second subset of upper level masks, the first subset of upper level masks defines intra-unit interconnections that interconnect the lower lever circuit structures within a modular unit, and the second subset of upper level masks defines both intra-unit interconnections that interconnect the lower level circuit structures within a modular unit, and inter-unit interconnections that interconnect the lower level circuit structures in different modular units;
a first modular unit with first circuit structures in a first modular circuit perimeter; and
a second modular unit with second circuit structures in a second modular circuit perimeter separated from the first modular circuit perimeter by a scribe line area, the second subset of upper level masks further defining a ring that is punctuated by at least a pair of openings, the openings configured to pass interconnections between the first modular unit and the second modular unit, the interconnections crossing the scribe line area to interconnect the first circuit structures with the second circuit structures.

14. The IC of claim 13, further comprising:
dummy structures formed in the scribe line area.

15. The IC of claim 13, wherein:
a first ring structure forms the first modular circuit perimeter; and
a second ring structure forms the second modular circuit perimeter.

16. The IC of claim 15, wherein the first ring and the second ring are configured to have openings in one or more metal layers to allow the interconnections to interconnect the first circuit structures with the second circuit structures.

17. The IC of claim 15, wherein the first ring and the second ring are configured to have openings in one or more upper metal layers to form the interconnections in the one or more upper metal layers.

18. The IC of claim 13, wherein
the first modular unit comprises a transmitting circuit;
the second modular unit comprises a receiving circuit; and
the interconnections are configured to interconnect the transmitting circuit with the receiving circuit.

19. The IC of claim 15, further comprising:
connection structures in one or more metal layers to connect the first ring structure with the second ring structure to form a complete ring.

20. The method of claim 1 wherein the ring in the second subset of upper level masks is disposed with a ring defined in the subset of lower level masks.

* * * * *